(12) United States Patent
Yang et al.

(10) Patent No.: US 10,797,118 B2
(45) Date of Patent: Oct. 6, 2020

(54) TOUCH PANEL, METHOD FOR FABRICATING THE SAME AND DISPLAY DEVICE

(71) Applicant: BOE Technology Group Co., Ltd., Beijing (CN)

(72) Inventors: Shengji Yang, Beijing (CN); Xue Dong, Beijing (CN); Xiaochuan Chen, Beijing (CN); Minghua Xuan, Beijing (CN); Lei Wang, Beijing (CN); Pengcheng Lu, Beijing (CN); Li Xiao, Beijing (CN); Dongni Liu, Beijing (CN); Jing Yu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/301,894

(22) PCT Filed: May 30, 2018

(86) PCT No.: PCT/CN2018/089064
§ 371 (c)(1),
(2) Date: Apr. 4, 2019

(87) PCT Pub. No.: WO2019/062178
PCT Pub. Date: Apr. 4, 2019

(65) Prior Publication Data
US 2019/0267431 A1    Aug. 29, 2019

(30) Foreign Application Priority Data

Sep. 27, 2017 (CN) .......................... 2017 1 0892282

(51) Int. Cl.
*H01L 27/32* (2006.01)
*H01L 51/52* (2006.01)
(Continued)

(52) U.S. Cl.
CPC .......... *H01L 27/323* (2013.01); *G06F 3/0412* (2013.01); *G06F 3/0443* (2019.05);
(Continued)

(58) Field of Classification Search
CPC ............... H01L 27/323; H01L 27/3246; H01L 51/5221; G06F 3/04164; G06F 3/0443;
(Continued)

(56) References Cited

U.S. PATENT DOCUMENTS 10,108,290 B2 * 10/2018 Hwang .................. G06F 3/0416
2015/0056724 A1 * 2/2015 Shieh ...................... H01L 22/12
438/14
(Continued)

*Primary Examiner* — Sardis F Azongha
(74) *Attorney, Agent, or Firm* — Arent Fox LLP; Michael Fainberg

(57) ABSTRACT

A touch panel, a method for fabricating the same, and a display device are provided. The touch panel includes: a base substrate, a plurality of touch electrode lines, a plurality of cathodes arranged in a matrix, and a plurality of spacers, where each cathode corresponds to at least one of the touch electrode lines, and each spacer includes a first photo spacer and a second photo spacer stacked successively; each touch electrode line includes a first lead part and a second lead part, wherein the first lead part is electrically connected with corresponding one of the cathodes, and the second lead part is configured to electrically connect the first lead part with a corresponding pin on a touch integrated circuit; and the first lead part at least covers the surface of the first photo spacer.

15 Claims, 11 Drawing Sheets

(51) Int. Cl.
*G06F 3/041* (2006.01)
*G06F 3/044* (2006.01)

(52) U.S. Cl.
CPC ...... *G06F 3/04164* (2019.05); *H01L 27/3246* (2013.01); *H01L 51/5221* (2013.01); *G06F 2203/04103* (2013.01)

(58) Field of Classification Search
CPC .... G06F 3/0412; G06F 3/044; G02F 1/13338; H05K 3/10
See application file for complete search history.

(56) References Cited

U.S. PATENT DOCUMENTS

| | | | | |
|---|---|---|---|---|
| 2016/0209441 A1* | 7/2016 | Mazzeo | ................ | G01P 15/125 |
| 2017/0205932 A1* | 7/2017 | Yang | .................... | G06F 3/0412 |
| 2018/0081474 A1* | 3/2018 | Yueh | .................... | H01L 27/323 |

* cited by examiner

S601 Form a plurality of spacers and a plurality of touch electrode lines on a base substrate S602 Form a cathode layer on the base substrate formed with the spacers and the touch electrode lines

TOUCH PANEL, METHOD FOR FABRICATING THE SAME AND DISPLAY DEVICE

This application is a National Stage of International Application No. PCT/CN2018/089064, filed May 30, 2018, which claims priority to Chinese Patent Application No. 201710892282.4, filed with the Chinese Patent Office on Sep. 27, 2017, and entitled "Touch panel, method for fabricating the same and display device", which is hereby incorporated by reference in its entirety.

FIELD

This disclosure relates to the field of display technologies, and particularly to a touch panel, a method for fabricating the same and a display device.

BACKGROUND

With the development of the display technologies, an Organic Light-Emitting Diode (OLED) display panel has been increasingly applied in the market due to its higher response speed, higher contrast, and wider angle of view. The touch technologies also have developed rapidly, and they have been increasingly popularized due to their compatibility with the display panel processes. At present, in an OLED touch panel, a multi-layer touch structure is generally fabricated on an encapsulation structure to thereby perform a touch function. However this may increase both the difficulty of its fabrication process and its fabrication cost. Furthermore it may be difficult to bond the touch structure satisfactorily even through film lamination.

SUMMARY

An embodiment of this disclosure provides a touch panel. The touch display includes a base substrate; a plurality of touch electrode lines; a plurality of cathodes arranged in a matrix, wherein each of the cathodes corresponds to at least one of the touch electrode lines; and a plurality of spacers located at gaps between the cathodes, wherein each of the spacers includes a first photo spacer and a second photo spacer stacked successively on the base substrate; wherein each of the touch electrode lines includes a first lead part and a second lead part, wherein the first lead part is electrically connected with corresponding one of the cathodes, and the second lead part is configured to electrically connect the first lead part with a corresponding pin on a touch integrated circuit; and the first lead part at least covers a surface of the first photo spacer, adjacent to the corresponding cathode connected therewith, facing the cathode.

Optionally in the touch panel according to the embodiment of this disclosure, the first lead part fully covers the surface of the first photo spacer, and the different first lead parts cover the different first photo spacers.

Optionally in the touch panel according to the embodiment of this disclosure, each of the cathodes corresponds to one of the touch electrode lines.

Optionally in the touch panel according to the embodiment of this disclosure, each of the cathodes corresponds to two of the touch electrode lines.

Optionally in the touch panel according to the embodiment of this disclosure, positive projections of the cathodes onto the base substrate overlap with positive projections of their adjacent first photo spacers onto the base substrate.

Optionally in the touch panel according to the embodiment of this disclosure, positive projections of the second photo spacers onto the base substrate do not overlap with the positive projections of the cathodes onto the base substrate.

Optionally in the touch panel according to the embodiment of this disclosure, the touch panel further includes a first insulation layer located between the first photo spacer and the second lead parts; the first insulation layer includes a plurality of via-holes corresponding to the touch electrode lines in a one-to-one manner; and the second lead parts of the touch electrode lines are electrically connected with the first lead parts through the via-holes.

Optionally in the touch panel according to the embodiment of this disclosure, the touch panel further includes a plurality of gate lines; and the second lead parts are arranged at the same layer as the gate lines, and the second lead parts are made of the same material as the gate lines.

Optionally in the touch panel according to the embodiment of this disclosure, the touch panel further includes a plurality of data lines; and the second lead parts are arranged at the same layer as the data lines, and the second lead parts are made of the same material as the data lines.

Optionally in the touch panel according to the embodiment of this disclosure, material of the first photo spacers includes positive photoresist, and material of the second photo spacers includes negative photoresist.

Correspondingly an embodiment of this disclosure further provides a display device including the touch panel according to the embodiments of this disclosure.

Correspondingly an embodiment of this disclosure further provides a method for fabricating a touch panel. The method includes: forming a plurality of spacers and a plurality of touch electrode lines on a base substrate, wherein each of the spacers includes a first photo spacer and a second photo spacer stacked successively on the base substrate; and each of the touch electrode lines includes a first lead part and a second lead part, the first lead part at least covers a surface of the first photo spacer, adjacent to a cathode to be connected therewith, facing the cathode, and the second lead part is configured to electrically connect the first lead part with a corresponding pin on a touch integrated circuit; and forming a cathode layer on the base substrate formed with the spacers and the touch electrode lines, wherein the cathode layer is segmented by the spacers into a plurality of cathodes arranged in a matrix, and each of the cathodes corresponds to at least one of the touch electrode lines, and is electrically connected with the first lead part of the corresponding touch electrode line.

Optionally in the method according to the embodiment of this disclosure, forming the plurality of spacers and the plurality of touch electrode lines on the base substrate includes: forming the second lead parts on the base substrate; forming the first photo spacers of the spacers on the base substrate formed with the second lead parts; forming the first lead parts on the base substrate formed with the first photo spacers; forming the second photo spacers, of the spacers, arranged opposite to the first photo spacers on the base substrate formed with the first lead parts; and cutting corners of the formed second photo spacers; and forming the cathode layer on the base substrate formed with the spacers and the touch electrode lines includes: forming the cathode layer on the base substrate after the corners of the second photo spacers are cut.

Optionally in the method according to the embodiment of this disclosure, cutting corners of the formed second photo spacers includes: cutting corners of the formed second photo spacers in a laser process.

Optionally in the method according to the embodiment of this disclosure, cutting corners of the formed second photo spacers includes: cutting corners of the formed second photo spacers in an ashing process.

Optionally in the method according to the embodiment of this disclosure, after the second lead parts of the touch electrode lines are formed on the base substrate, and before the first photo spacers of the spacers are formed on the base substrate formed with the second lead parts, the method further includes: forming a first insulation layer on the base substrate; and forming via-holes corresponding to the touch electrode lines in a one-to-one manner by patterning the formed first insulation layer.

DETAILED DESCRIPTION

Figure 1:
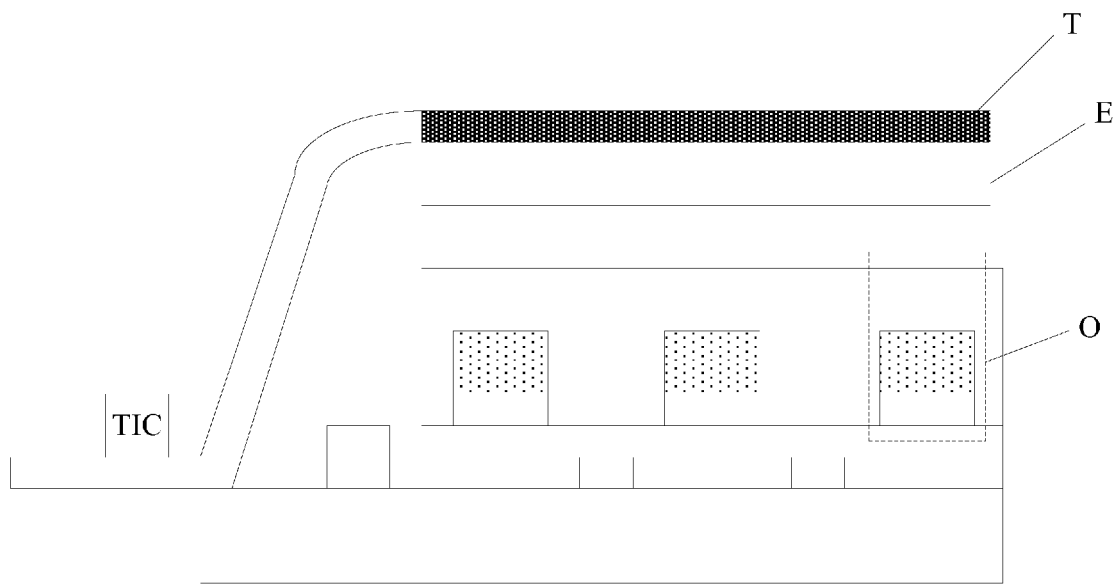
FIG. 1 is a schematic diagram of a touch structure in the related art.

As illustrated in FIG. 1, an OLED touch panel generally can include: light-emitting structures O, an encapsulation structure E (e.g., a thin encapsulation film or an encapsulation cover plate), and a multi-layer touch structure T arranged on the side of the encapsulation structure E away from the light-emitting structures O. The material of the touch structure T is generally Indium Tin Oxide (ITO), and the ITO has poor bending, so it may be difficult to bond the touch structure T with a Touch Integrated Circuit (TIC). Furthermore the multi-layer touch structure T is additionally arranged, so both the thickness of the panel and the fabrication cost thereof may be increased. Moreover it may be difficult to bond the touch structure satisfactorily even through film lamination.

Figure 2A:
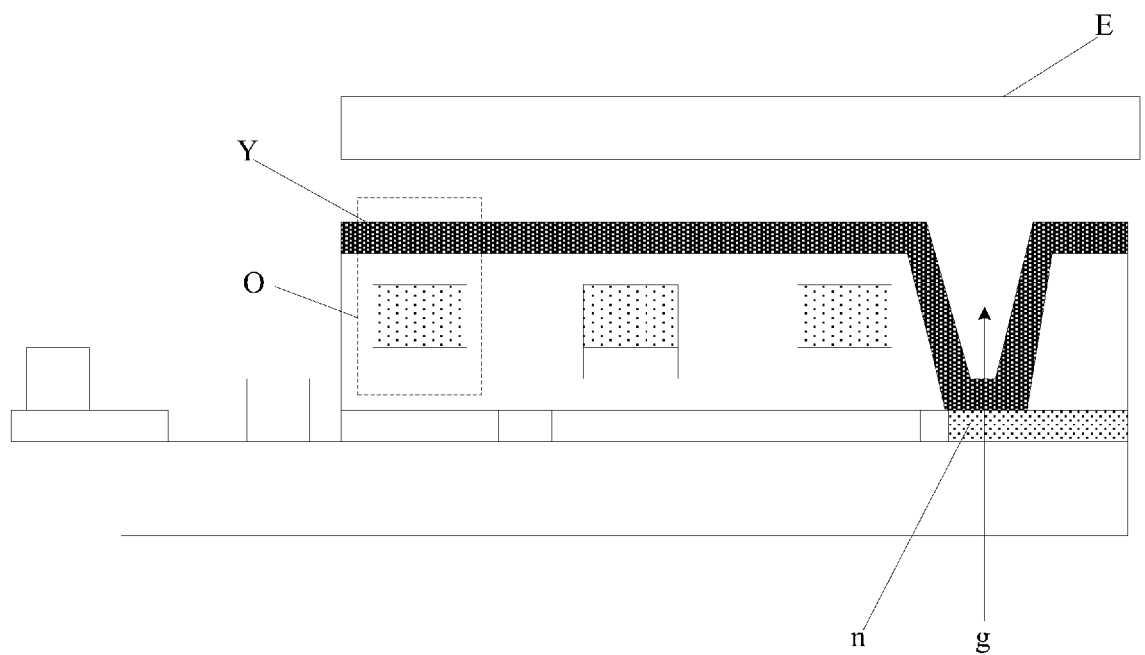
FIG. 2a is a schematic diagram of a touch structure including a single layer of touch electrodes in the related art.
Figure 2B:
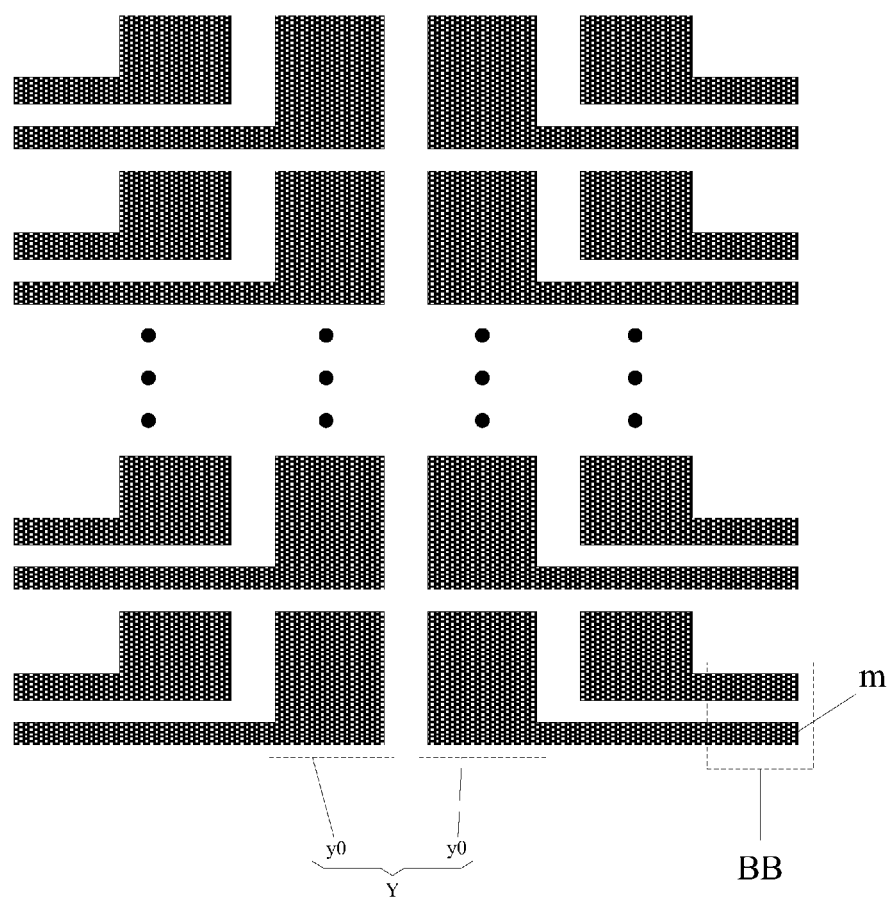
FIG. 2b is a schematic diagram of distributed touch electrodes in the related art.

In order to reduce the thickness of the panel, and to lower the difficulty and the cost of the fabrication process thereof, a single layer of touch electrodes can be arranged to perform a touch function, and particularly it is more desirable to make the display products, e.g., mobile phones, etc., (with a display panel of 4 inches and more) light-weighted and thinned. As illustrated in FIG. 2a, a cathode Y in each light-emitting structure O is generally located at the topmost functional layer, and the cathode Y is segmented and patterned into touch electrodes y0 and a touch line m as illustrated in FIG. 2b. The touch line m is arranged at the same layer as the cathode Y, and connected with underlying metal lines n through via-hole g in a peripheral area of the display panel. It is possible for a touch panel with a small size to arrange such single layer of touch electrodes to perform a touch function as described above. However as the size of the touch panel is growing, the number of touch electrodes is also increasing as illustrated in FIG. 2b, so that there may be a blind touch area in an area BB occupied by the touch lines m, where the width of the blind touch area is determined directly by the number of touch electrodes. Furthermore the size of the touch electrode Y may not be exactly uniform due to the touch lines m, thus degrading the uniformity of a touch.

Accordingly the embodiments of this disclosure provide a touch panel, a method for fabricating the same, and a display device so as to improve the uniformity of a touch on the touch panel to thereby improve the precision of the touch.

In order to make the objects, technical solutions, and advantages of this disclosure more apparent, implementations of the touch panel, the method for fabricating the same and the display device according to the embodiments of this disclosure will be described below in further details with reference to the drawings. It shall be appreciated that the preferable embodiments to be described below are only intended to illustrate and explain this disclosure, but not to limit this disclosure thereto. Furthermore the embodiments of this disclosure, and the features in the embodiments can be combined with each other unless they conflict with each other.

Referring to FIG. 3a to FIG. 4c (a second photo spacer P2 is not illustrated in FIG. 3a to FIG. 3c) together, a touch panel according to an embodiment of this disclosure can include: a base substrate 100, a plurality of touch electrode lines L located on one side of the base substrate 100, a plurality of cathodes Y located on the side of the base substrate 100 on which the touch electrode lines L are located, and the plurality of cathodes Y are arranged in a matrix, and a plurality of spacers located at gaps between the cathodes Y. Each cathode Y corresponds to at least one of the touch electrode lines L. Spacers can include: a first photo spacer P1 and a second photo spacer P2 stacked successively on the base substrate 100, that is, the first photo spacer P1 is located on the base substrate 100, and the second photo spacer P2 is located on the first photo spacer P1.

Furthermore each touch electrode line L includes a first lead part L1 and a second lead part L2, where the first lead part L1 is electrically connected with corresponding one of the cathodes Y, and the second lead part L2 is configured to electrically connect the first lead part L1 with a corresponding pin on a touch integrated circuit (which is not shown in FIGS. 3a to 4c); and the first lead part L1 at least covers the surface of the first photo spacer P1, adjacent to the cathode Y connected therewith, facing the cathode Y.

In the touch panel above according to the embodiment of this disclosure, the cathodes are reused as touch electrodes, and the cathodes arranged in a matrix are electrically connected with the touch integrated circuit through the touch electrode lines to perform a touch function. The first lead part of the touch electrode line at least cover the surface of the first photo spacer, adjacent to the cathode connected therewith, facing the cathode, that is, the first lead part extend on the first photo spacer, so that the cathode can be electrically connected directly with the first lead part. After the touch panel is configured with the touch integrated circuit, the first lead part can be electrically connected with the touch integrated circuit through the second lead part to thereby perform a touch function. As compared with FIG. 2a and FIG. 2b where the touch electrodes perform a touch function through the touch lines arranged at the same layer as the touch electrodes, there isn't any blind touch area; and in the embodiment of this disclosure, the plurality of cathodes with a uniform size arranged in a matrix can be reused as the touch electrodes to thereby avoid the poor uniformity of a touch due to a non-uniform size of the touch electrodes.

Figure 3A:
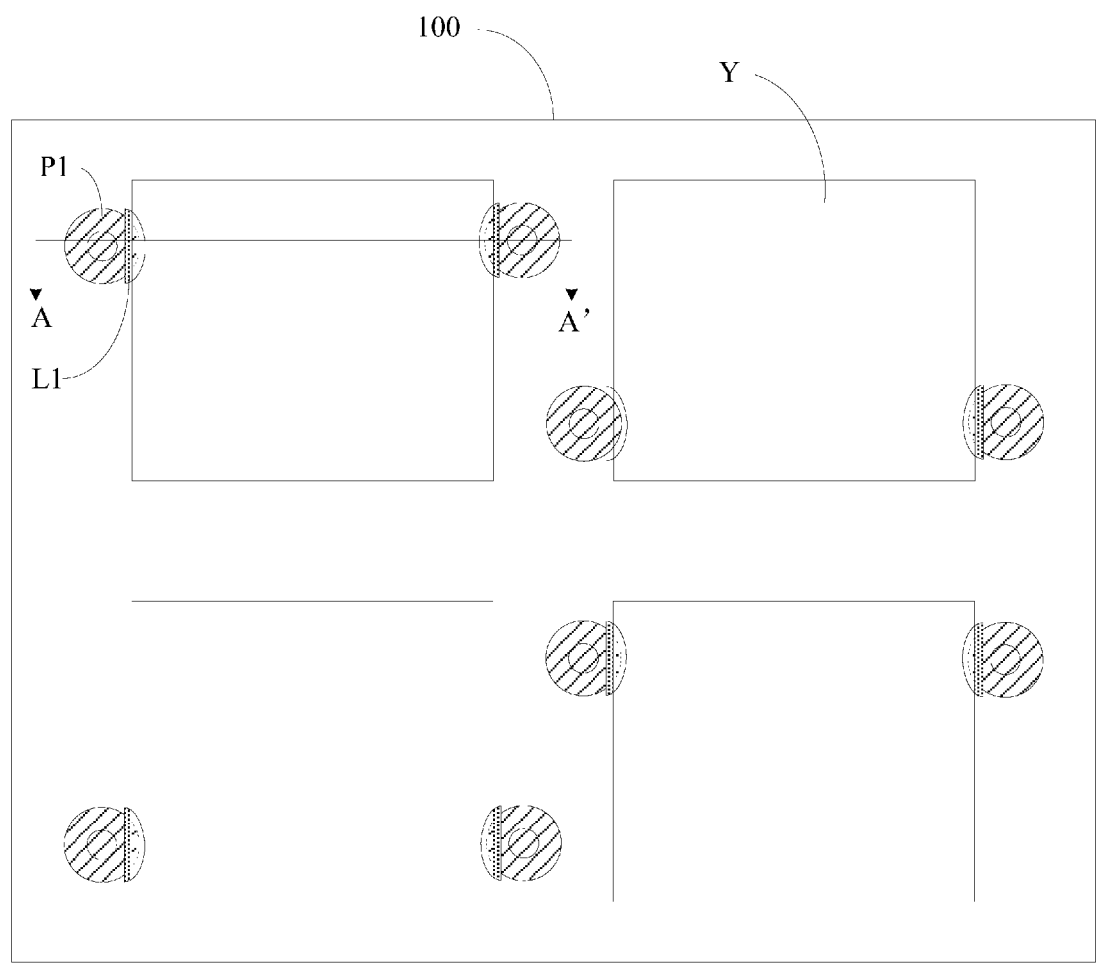
FIG. 3a to FIG. 3c are schematic structural diagrams respectively of a touch panel according to an embodiment of this disclosure in top views.
Figure 3B:
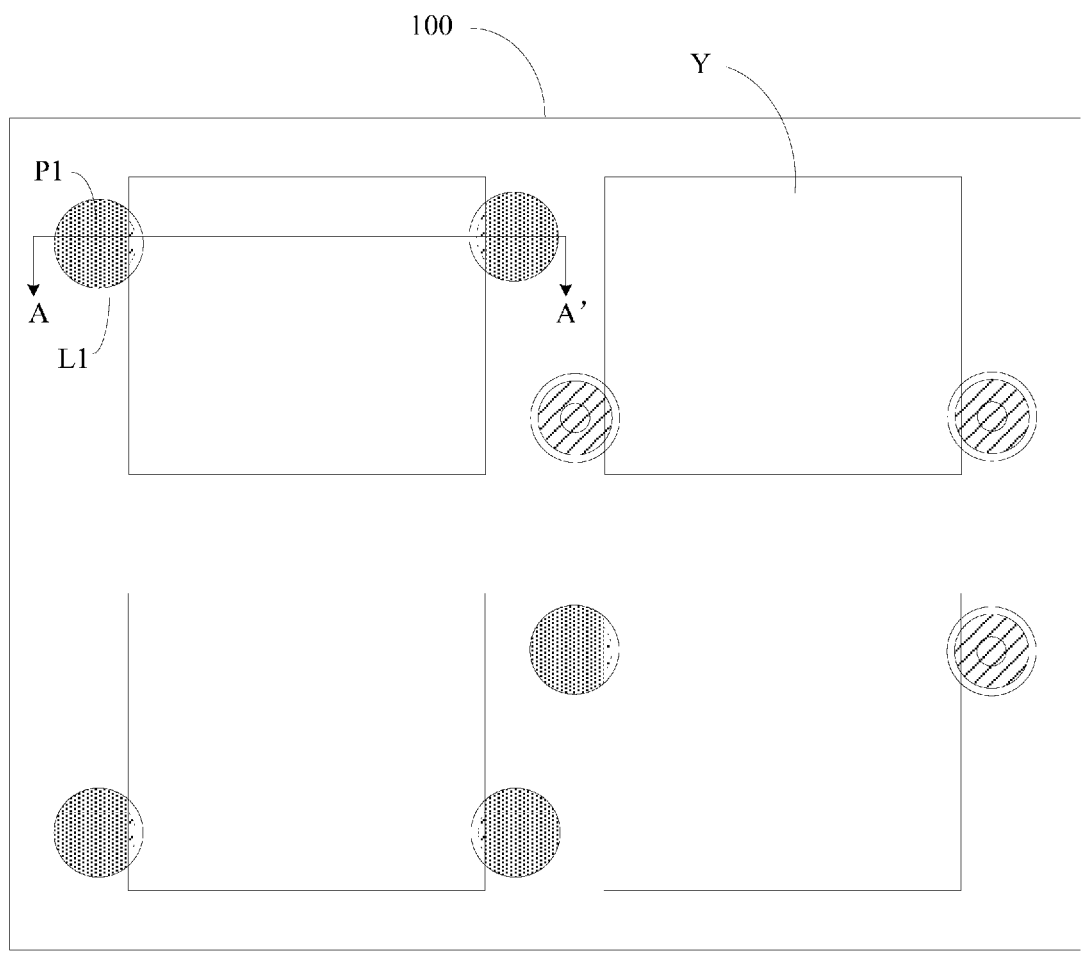
Figure 3C:
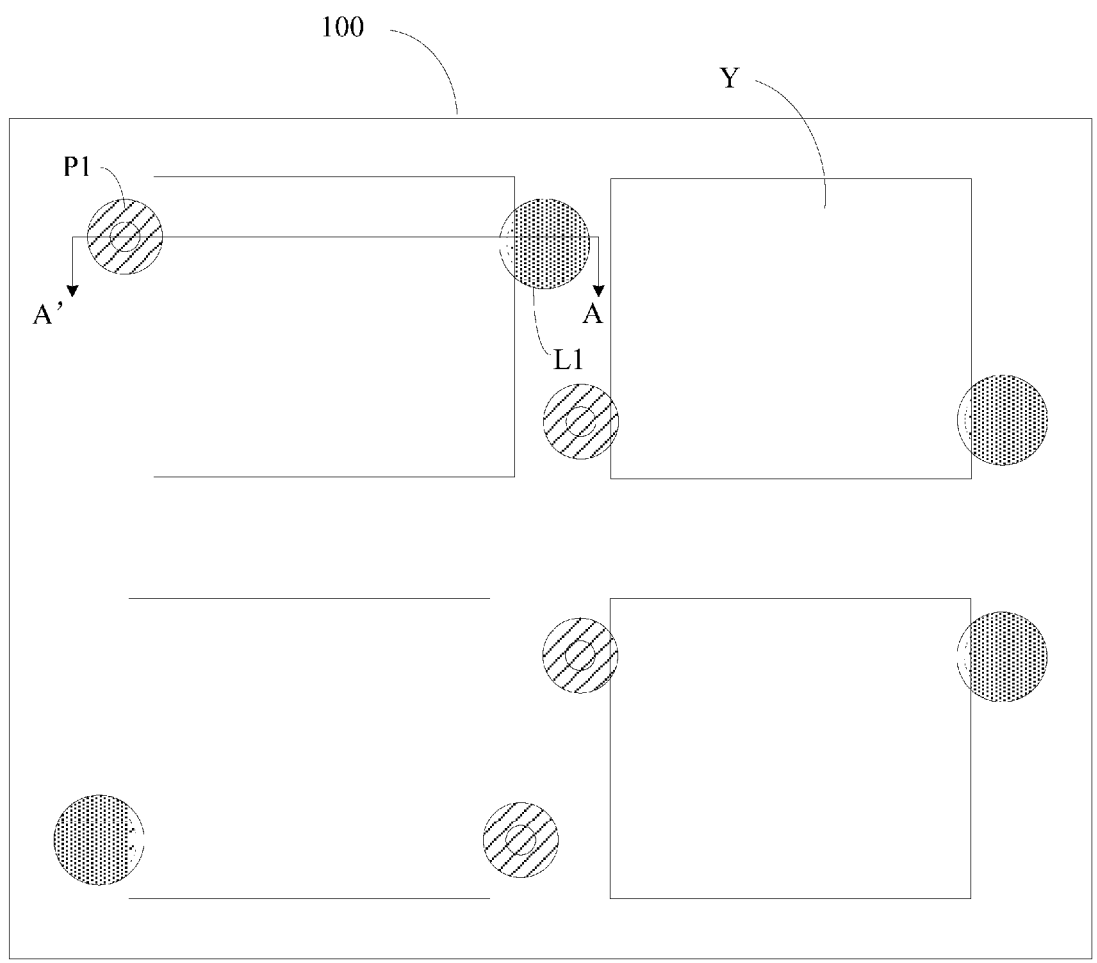

In a specific implementation, in the touch panel above according to the embodiment of this disclosure, as illustrated in FIG. 3a and FIG. 3c, the first lead parts L1 can cover the surfaces of the first photo spacers P, adjacent to the cathodes Y connected therewith, facing the cathodes Y. Alternatively, in order to further electrically connect them, as illustrated in FIG. 3b, the first lead parts L1 can fully the surfaces of the first photo spacers P1, and in order to avoid the first lead parts L1 from being short-circuited, the different first lead parts L1 can cover the different first photo spacers P1. Furthermore the spacers are arranged at the gaps between the cathodes Y so that there are gaps between the spacers and the cathodes Y, and when the first lead parts L1 fully covers the surfaces of the first photo spacers P1, in order for the first lead parts L1 to be electrically connected with their corresponding cathodes Y, the gaps between the first photo spacers P1 and those cathodes Y may be filled with the material of the first lead parts L1, and the gaps between the first photo spacers P1 and the other cathodes Y may not be completely filled with the material of the first lead parts L1, so that there are gaps between the first lead parts L1 and the other cathodes Y to thereby avoid the first lead parts L1 from being short-circuited with the other cathodes Y.

In a specific implementation, in the touch panel above according to the embodiment of this disclosure, the numbers of touch electrode lines corresponding to a part of the cathodes may be different. For example, a part of the cathodes may each correspond to one of the touch electrode lines, and the other cathodes may each correspond to two of the touch electrode lines, or a part of the cathodes may each correspond to three of the touch electrode lines, and the other cathodes may each correspond to two of the touch electrode lines, although the embodiment of this disclosure will not be limited thereto.

Figures 5, 6:
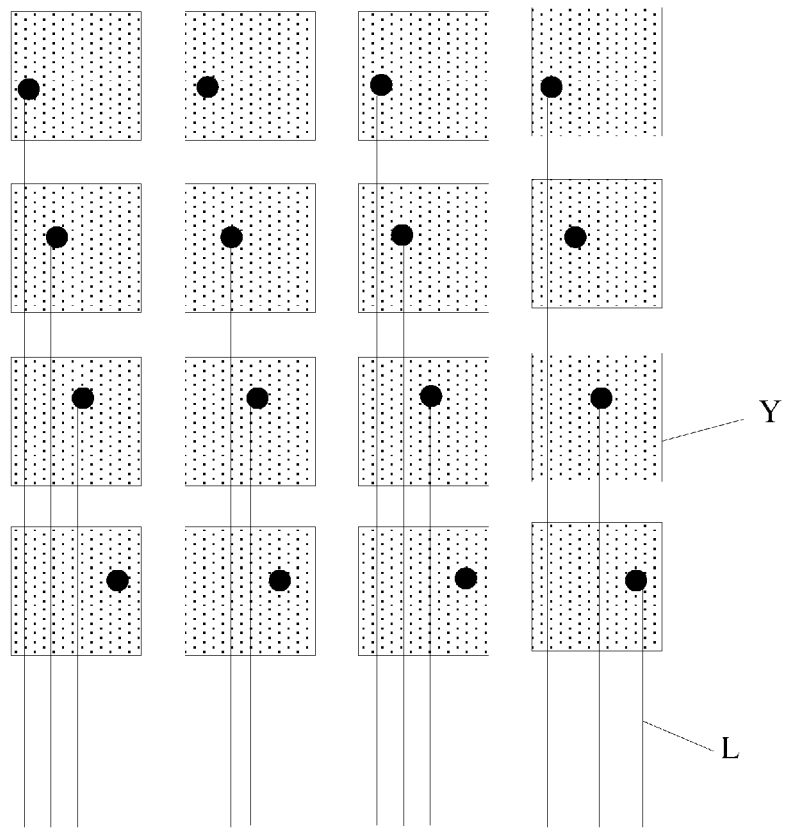
FIG. 5 is a schematic diagram of distributed cathodes and touch electrode lines according to an embodiment of this disclosure.
FIG. 6 is a flow chart of a method for fabricating a touch panel according to an embodiment of this disclosure.

In order to arrange the touch electrode lines uniformly, in a specific implementation, in the touch panel above according to the embodiment of this disclosure, the numbers of touch electrode lines corresponding to the each cathode may be the same. For example, as illustrated in FIG. 3c and FIG. 5, each cathode Y may correspond to one of the touch electrode lines L, so that the number of touch electrode lines L to be arranged may be the least; or as illustrated in FIG. 3a and FIG. 3b, each cathode Y may correspond to two of the touch electrode lines L, so that when one of the touch electrode lines L fails, a signal can be transmitted on the other touch electrode line L.

In a specific implementation, in the touch panel above according to the embodiment of this disclosure, the material of the first photo spacers can include positive photoresist, and the material of the second photo spacers can include negative photoresist. Specifically the first photo spacers and the second photo spacers can be made respectively of positive photoresist and negative photoresist so that the first photo spacers and the second photo spacers can be patterned to be symmetric to each other. Of course, alternatively the material of the first photo spacers can include negative photoresist, and the material of the second photo spacers can include positive photoresist, although the embodiment of this disclosure will not be limited thereto.

Figure 4A:
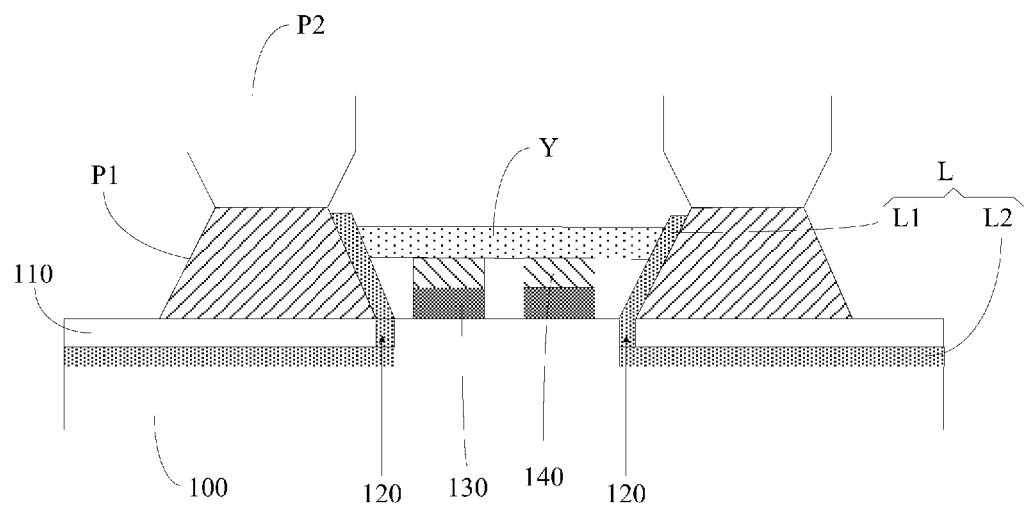
FIG. 4a is a schematic structural diagram of the touch panel as illustrated in FIG. 3a along AA' in a sectional view.
Figure 4B:
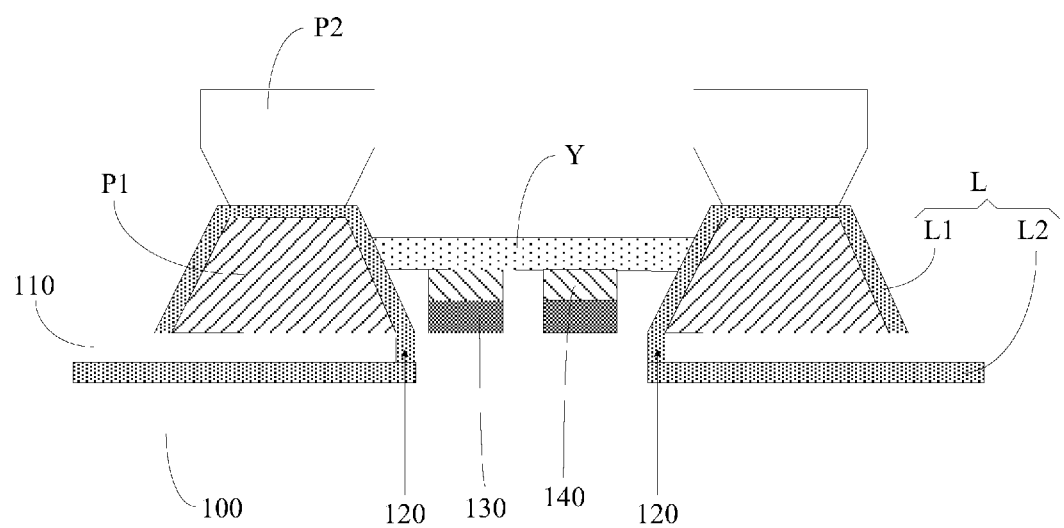
FIG. 4b is a schematic structural diagram of the touch panel as illustrated in FIG. 3b along AA' in a sectional view.
Figure 4C:
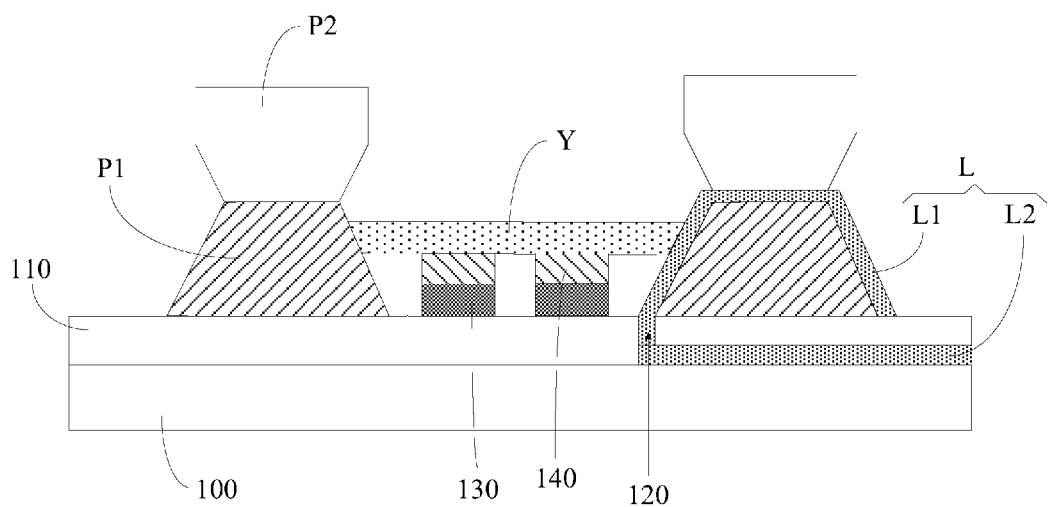
FIG. 4c is a schematic structural diagram of the touch panel as illustrated in FIG. 3c along AA' in a sectional view.

In a specific implementation, in the touch panel above according to the embodiment of this disclosure, as illustrated in FIG. 4a to FIG. 4c, the shape of the cross section of each first photo spacer P1 can include an isosceles trapezoid so that the shape of the cross section of each second photo spacer P2 can be an upside-down isosceles trapezoid; and two base corners of the upside-down isosceles trapezoid can be cut off so that a cathode to be formed can be electrically connected with a first lead part L1 covering the surface of the first photo spacer P1. Of course, the cross section of each first photo spacer can alternatively be in another shape in a real application, although the embodiment of this disclosure will not be limited thereto.

In a specific implementation, in the touch panel above according to the embodiment of this disclosure, as illustrated in FIG. 4a to FIG. 4c, positive projections of the second photo spacers P2 onto the base substrate 100 do not overlap with positive projections of the cathodes Y onto the base substrate 100, so that the cathodes Y can be fabricated in a process while avoiding the second photo spacers P2 from shielding the side surfaces of the first photo spacers P1 so as not to hinder the cathodes to be formed from contacting with the side surfaces of the first photo spacers P1. Furthermore a positive projection of each second photo spacer P2 onto the base substrate 100 can further lie into a positive projection of a first photo spacer P1 in the same spacer onto the base substrate 100.

Furthermore in order to enable the cathodes to contact with the first lead parts on the side surfaces of the first photo spacers, in a specific implementation, in the touch panel above according to the embodiment of this disclosure, as illustrated in FIG. 3a to FIG. 4c, positive projections of the cathodes Y onto the base substrate 100 can overlap with positive projections of their adjacent first photo spacers P1 onto the base substrate 100, so that the cathodes Y can extend to the side surfaces of the first photo spacers P1, and thus direct contact with the first lead parts L1 covering the side surfaces of the first photo spacers P1.

In a specific implementation, in the touch panel above according to the embodiment of this disclosure, as illustrated in FIG. 4a to FIG. 4c, the touch panel can further include: a first insulation layer 110 located between the first photo spacers P1 and the second lead parts L2, where the first insulation layer 110 can include a plurality of via-holes 120 corresponding to the touch electrode lines L in a one-to-one manner, and the second lead parts L2 of the touch electrode lines L are electrically connected with the first lead parts L1 through the via-holes 120. Specifically a material filled in the via-holes 120 is the material of the first lead parts L1, that is, the first lead parts L1 can be fabricated in a process by completely filling the via-holes 120 with the material of the first lead parts L1 so that the first lead parts L1 are electrically connected with the second lead parts L2.

In a specific implementation, in the touch panel above according to the embodiment of this disclosure, the material of the first lead parts and the second lead parts in the touch electrode lines can include Ti, Al, and Ti layers stacked. This combination of metal materials can alleviate the impedances of the touch electrode lines from affecting the touch performance. Of course, the first lead parts and the second lead parts of the touch electrode lines can alternatively include another satisfactory combination of metal materials stacked as needed, although the embodiment of this disclosure will not be limited thereto.

In a specific implementation, in the touch panel above according to the embodiment of this disclosure, as illustrated in FIG. 4a to FIG. 4c, the touch panel can further include: anodes 130 located between the first insulation layer 110 and the cathodes Y, and a light-emitting functional layer 140 located between the anodes 130 and the cathodes Y, where the light-emitting functional layer 140 can include a light-emitting layer. Of course, the light-emitting functional layer 140 can further include a hole injection layer, a hole transport layer, an electron injection layer, an electron transport layer, etc., although the embodiment of this disclosure will not be limited thereto.

The touch panel is generally further configured with gate lines for transmitting a gate scan signal, data lines for transmitting a data signal, and thin film transistors, that is, the touch panel is configured with an active layer, a gate insulation layer, a gate layer, an interlayer medium layer, a source and drain layer, a planarization layer, an inter-anode insulation layer located between the anodes, etc., so in a specific implementation, in the touch panel above according to the embodiment of this disclosure, the touch panel further includes a plurality of gate lines, where the second lead parts may be arranged at the same layer as the gate lines, and made of the same material as the gate lines. In this way, an additional process of fabricating the respective second lead parts may not be performed, but the respective second lead parts and the respective gate lines can be patterned in only one patterning process to thereby simplify the fabrication process, save the production cost, and improve the production efficiency. The gate lines are generally arranged at the same layer as the gate layer and made of the same material as the gate layer, so the first insulation layer can include: an interlayer medium layer, a planarization layer, and an inter-anode insulation layer. Furthermore the structures and functions of the respective layers above can be substantially the same as those in the related art, and a repeated description thereof will be omitted here.

In a specific implementation, in the touch panel above according to the embodiment of this disclosure, the touch panel further include a plurality of data lines, where the respective second lead parts can be arranged at the same layer as the data lines, and made of the same material as the data lines. In this way, an additional process of fabricating the respective second lead parts may not be performed, but the respective second lead parts and the respective data lines can be patterned in only one patterning process to thereby simplify the fabrication process, save the production cost, and improve the production efficiency. In this manner, the first insulation layer can include: a planarization layer and an inter-anode insulation layer.

Of course, in a specific implementation, in the touch panel above according to the embodiment of this disclosure, each first insulation layer can alternatively be an additionally arranged insulation layer, and in this manner, the first insulation layer can be located between an inter-anode insulation layer and a first photo spacer. Of course, the first insulation layer can be arranged as needed in a real application environment in a real application, although the embodiment of this disclosure will not be limited thereto.

Based upon the same idea of this disclosure, an embodiment of this disclosure further provides a display device including the touch panel above according to the embodiment of this disclosure. Since the display device addresses the problem under a similar principle to the touch panel, reference can be made to the implementation of the touch panel above for an implementation of the display device, and a repeated description thereof will be omitted here.

In a specific implementation, the display device according to the embodiment of this disclosure can be a mobile phone, a tablet computer, a TV set, a display, a notebook computer, a digital photo frame, a navigator, or any other product or component with a display function. All the other components indispensable to the display device shall readily occur to those ordinarily skilled in the art, so a repeated description thereof will be omitted here, and the embodiment of this disclosure will not be limited thereto.

Based upon the same idea of this disclosure, an embodiment of this disclosure further provides a method for fabricating a touch panel, and as illustrated in FIG. 6, the method can include the following steps.

The step S601 is to form a plurality of spacers and a plurality of touch electrode lines on a base substrate.

Each spacer includes a first photo spacer and a second photo spacer stacked successively on the base substrate; and each touch electrode line includes a first lead part and a second lead part, the first lead part at least covers the surface of the first photo spacer, adjacent to a cathode to be connected therewith, facing the cathode, and the second lead part is configured to electrically connect the first lead part with a corresponding pin on a touch integrated circuit.

The step S602 is to form a cathode layer on the base substrate formed with the spacers and the touch electrode lines.

The cathode layer is segmented by the spacers into a plurality of cathodes arranged in a matrix, and each cathode corresponds to at least one of the touch electrode lines, and is electrically connected with the first lead part of the corresponding touch electrode line.

In the method above according to the embodiment of this disclosure, the spacers including the first photo spacers and the second photo spacers, the cathodes, and the touch electrode lines are formed on the base substrate, the cathodes are reused as touch electrodes, and the cathodes arranged in a matrix are electrically connected with the touch integrated circuit through the touch electrode lines to perform a touch function. The first lead parts of the touch electrode lines at least cover the surfaces of the first photo spacers, adjacent to the cathodes to be connected therewith, facing the cathodes, that is, the cathodes can be electrically connected directly with the first lead parts, and the first lead parts can be electrically connected with the touch integrated circuit through the second lead parts to thereby perform a touch function. As compared with the related art in which the touch electrodes perform a touch function through the touch lines arranged at the same layer as the touch electrodes, there isn't any blind touch area; and in the embodiment of this disclosure, the plurality of cathodes with a uniform size arranged in a matrix can be reused as the touch electrodes to thereby avoid the poor uniformity of a touch due to a non-uniform size of the touch electrodes.

Figure 7:
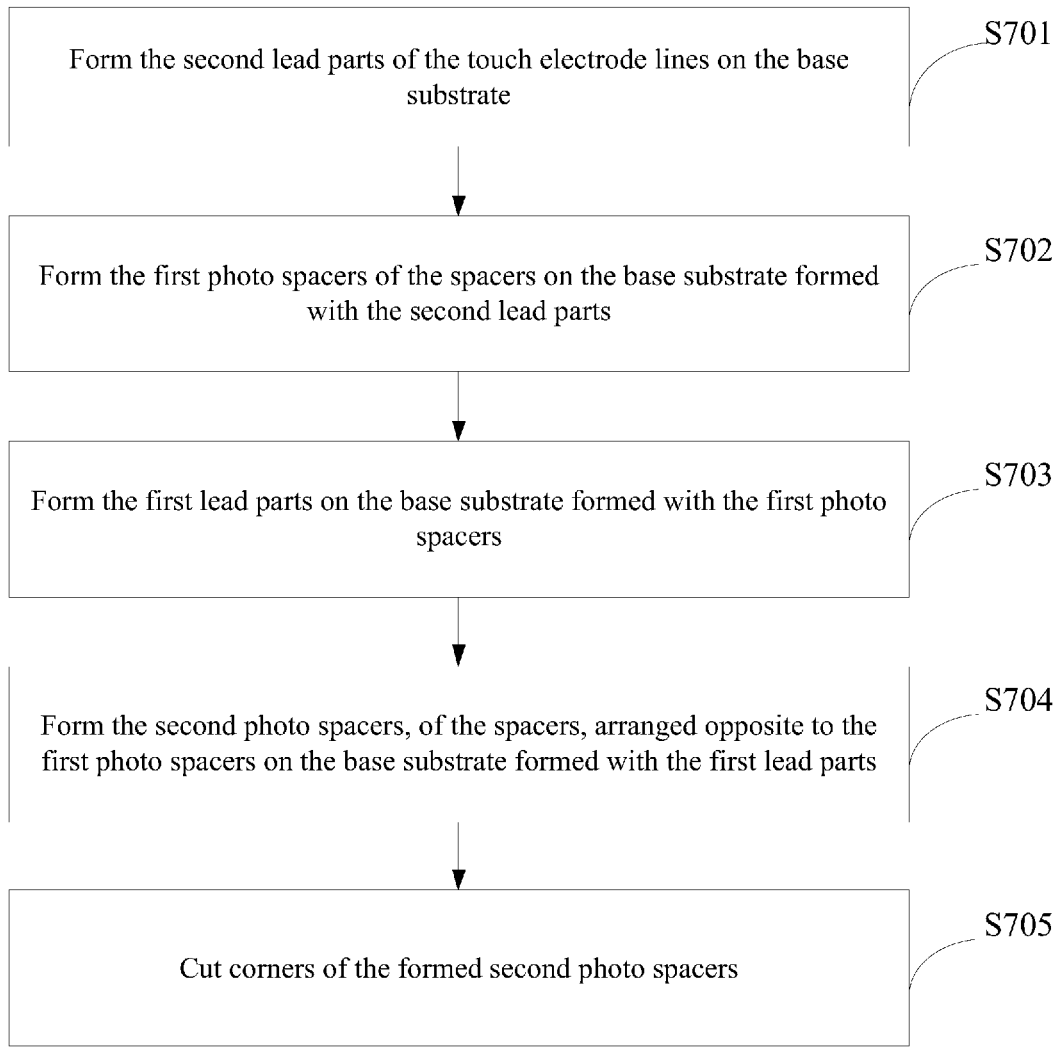
FIG. 7 is a detailed flow chart of the method for fabricating a touch panel according to the embodiment of this disclosure.

In a specific implementation, in the fabricating method above according to the embodiment of this disclosure, as illustrated in FIG. 7, the step S601 can specifically include the following steps.

The step S701 is to form the second lead parts of the electrode lines on the base substrate.

The step S702 is to form the first photo spacers of the spacers on the base substrate formed with the second lead parts.

The step S703 is to form the first lead parts on the base substrate formed with the first photo spacers.

The step S704 is to form the second photo spacers, of the spacers, arranged opposite to the first photo spacers on the base substrate formed with the first lead parts.

The step S705 is to cut corners of the formed second photo spacers.

Forming the cathode layer on the base substrate formed with the spacers and the touch electrode lines can specifically include: forming the cathode layer on the base substrate after the corners of the second photo spacers are cut.

After the second lead parts are formed, and before the first photo spacers are formed, the method can further include the following steps: forming a first insulation layer on the base substrate; and forming via-holes corresponding to the respective touch electrode lines in a one-to-one manner by patterning the formed first insulation layer.

Furthermore a light-emitting functional layer is further formed before corners of the second photo spacers are cut, where a light-emitting layer can be formed in an evaporating process.

In a specific implementation, in the fabricating method above according to the embodiment of this disclosure, an active layer, a gate insulation layer, a gate layer, an interlayer medium layer, a source and drain layer, a planarization layer, an inter-anode insulation layer located between anodes, etc., are further formed, and fabrication processes of the respective functional layers can be the same as in the related art, so a repeated description thereof will be omitted here.

The fabricating method above according to the embodiment of this disclosure will be described taking the touch panel as illustrated in FIG. 4b as an example, but it shall be noted that a specific fabrication process thereof will not be limited thereto.

The method for fabricating the touch panel as illustrated in FIG. 4b according to the embodiment of this disclosure can include the following steps.

Figure 8A:
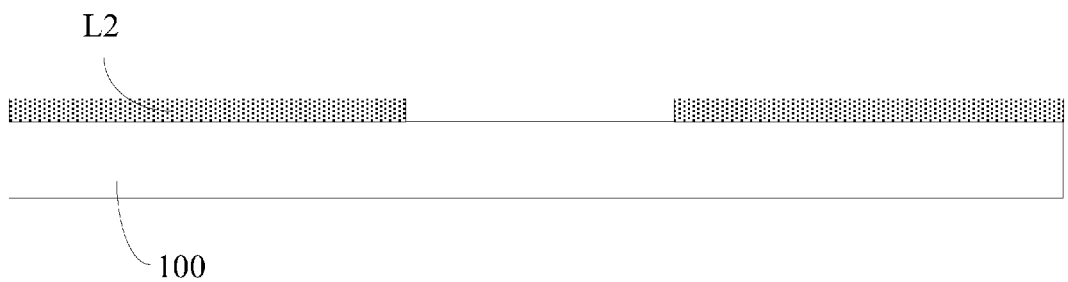
FIG. 8a to FIG. 8f are schematic diagrams respectively of a process of fabricating a touch panel according to an embodiment of this disclosure.

(1) Patterning the second lead parts L2 on the base substrate 100 in a patterning process as illustrated in FIG. 8a.

Figure 8B:
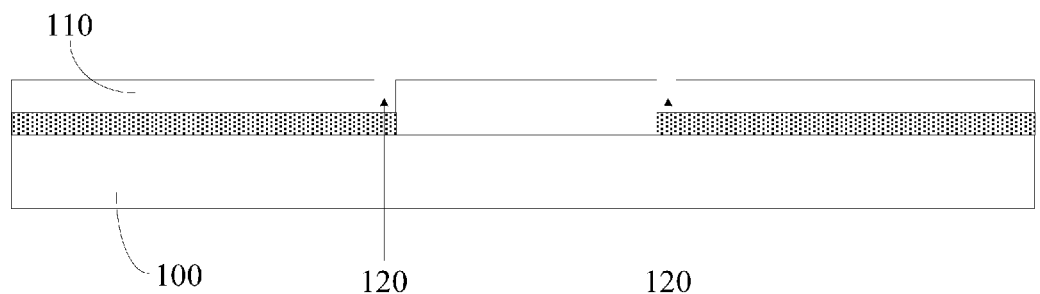

(2) Patterning the first insulation layer 110 including the via-holes 120 on the base substrate 100 in a patterning process as illustrated in FIG. 8b.

Figure 8C:
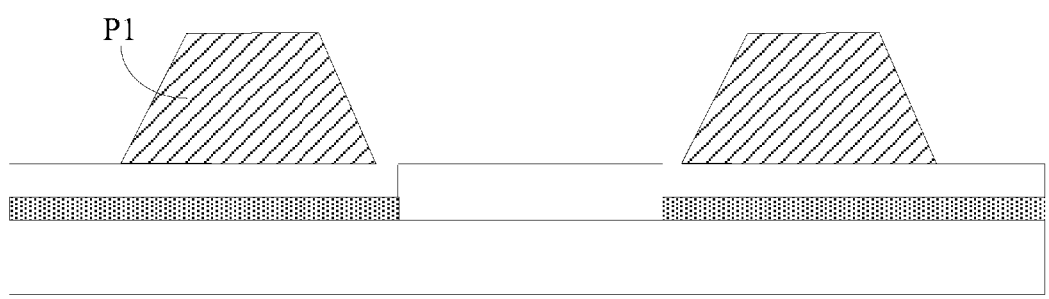

(3) Patterning the first photo spacers P1 on the base substrate 100 using positive photoresist in a patterning process as illustrated in FIG. 8c.

Figure 8D:
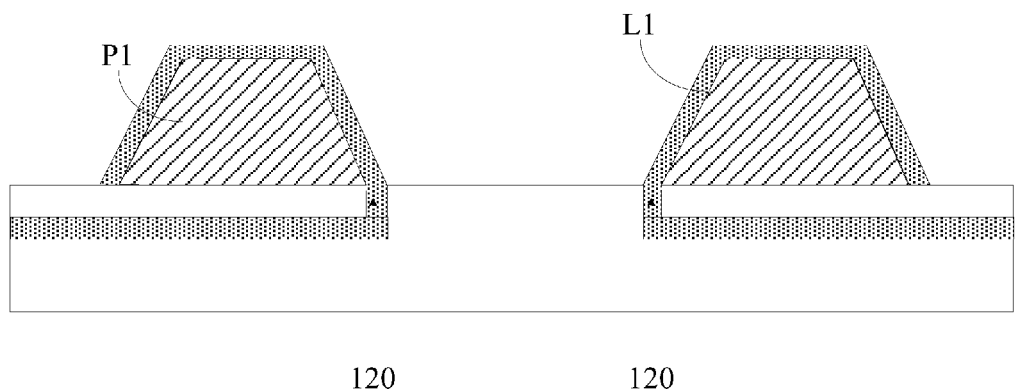

(4) Patterning the first lead parts L1 covering the first photo spacers P1 on the base substrate 100 in a patterning process as illustrated in FIG. 8d, where the first lead parts L1 are electrically connected with their corresponding second lead parts L2 through the via-holes 120.

Figure 8E:
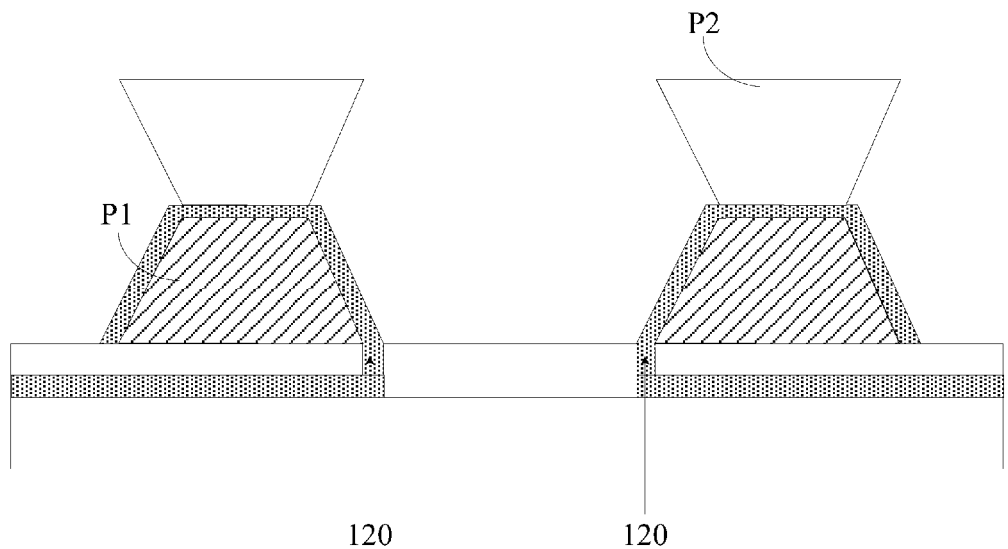

(5) Patterning the second photo spacers P2, arranged opposite to the first photo spacers P1, on the base substrate 100 using negative photoresist in a patterning process as illustrated in FIG. 8e.

Specifically the first supports and the second photo spacers are fabricated respectively using the positive and negative photoresist so that the first photo spacers and the second photo spacers can be patterned to be symmetric to each other, where the shape of the cross section of each first photo spacer P1 can include an isosceles trapezoid so that the shape of the cross section of each second photo spacer P2 can be an upside-down isosceles trapezoid as illustrated in FIG. 8e.

Figure 8F:
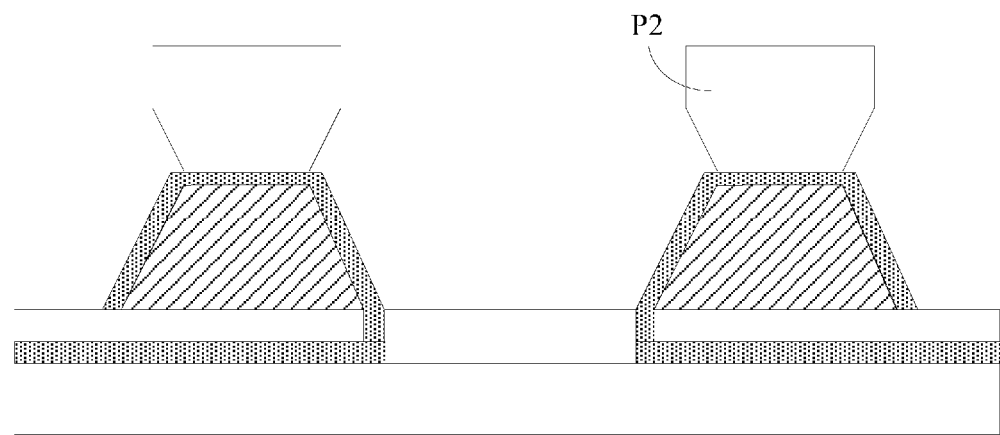

(6) Cutting corners of the formed second photo spacers P2 as illustrated in FIG. 8f.

Specifically the corners of the formed second photo spacers can be cut in a laser process or an ashing process, that is, two base corners of the upside-down isosceles trapezoid can be cut off so that a cathode to be formed can be electrically connected with a first lead part covering the surface of the first photo spacer.

(7) Forming the cathode layer including the cathodes Y on the base substrate 100 in a patterning process after the corners of the second photo spacers P2 are cut, as illustrated in FIG. 4b.

It shall be noted that in the fabricating method above according to the embodiment of this disclosure, the patterning process can include a photolithograph process, or can include a photolithograph process and an etching step, and can also include printing, ink-jetting, and other processes for forming a predetermined pattern; and the photolithograph process refers to such a process of forming a pattern using photoresist, a mask, an exposure machine, etc., that includes film formation, exposure, development, etc. In a specific implementation, a corresponding patterning process can be selected for a structure to be formed in the embodiment of this disclosure.

In the touch panel, the method for fabricating the same, and the display device according to the embodiments of this disclosure, the cathodes are reused as touch electrodes, and the cathodes arranged in a matrix are electrically connected with the touch integrated circuit through the touch electrode lines to perform a touch function. The first lead parts of the touch electrode lines at least cover the surfaces of the first photo spacers, adjacent to the cathodes connected therewith, facing the cathodes, that is, the first lead parts extend on the first photo spacers so that the cathodes can be electrically connected directly with the first lead parts, and after the touch panel is arranged with the touch integrated circuit, the first lead parts can be electrically connected with the touch integrated circuit through the second lead parts to thereby perform a touch function. As compared with FIG. 2a and FIG. 2b where the touch electrodes perform a touch function through the touch lines arranged at the same layer as the touch electrodes, there isn't any blind touch area; and in the embodiment of this disclosure, the plurality of cathodes with a uniform size arranged in a matrix can be reused as the touch electrodes to thereby avoid the poor uniformity of a touch due to a non-uniform size of the touch electrodes.

Evidently those skilled in the art can make various modifications and variations to the disclosure without departing from the spirit and scope of this disclosure. Thus the disclosure is also intended to encompass these modifications and variations thereto so long as the modifications and variations come into the scope of the claims appended to the disclosure and their equivalents.

The invention claimed is:

1. A touch panel, comprising:
    a base substrate;
    a plurality of touch electrode lines;
    a plurality of cathodes arranged in a matrix, wherein each of the cathodes corresponds to at least one of the touch electrode lines; and
    a plurality of spacers located at gaps between the cathodes, wherein each of the spacers comprises a first photo spacer and a second photo spacer stacked successively on the base substrate;
    wherein each of the touch electrode lines comprises a first lead part and a second lead part, wherein the first lead part is electrically connected with corresponding one of the cathodes, and the second lead part is configured to electrically connect the first lead part with a corresponding pin on a touch integrated circuit; and
    the first lead part at least covers a surface of the first photo spacer, adjacent to the corresponding cathode connected therewith, facing the cathode;

wherein the first lead part fully covers the surface of the first photo spacer, and the different first lead parts cover the different first photo spacers.

2. The touch panel according to claim 1, wherein each of the cathodes corresponds to one of the touch electrode lines.

3. The touch panel according to claim 1, wherein each of the cathodes corresponds to two of the touch electrode lines.

4. The touch panel according to claim 1, wherein positive projections of the cathodes onto the base substrate overlap with positive projections of their adjacent first photo spacers onto the base substrate.

5. The touch panel according to claim 4, wherein positive projections of the second photo spacers onto the base substrate do not overlap with the positive projections of the cathodes onto the base substrate.

6. The touch panel according to claim 1, wherein the touch panel further comprises a first insulation layer located between the first photo spacer and the second lead parts;
the first insulation layer comprises a plurality of via-holes corresponding to the touch electrode lines in a one-to-one manner; and
the second lead parts of the touch electrode lines are electrically connected with the first lead parts through the via-holes.

7. The touch panel according to claim 6, further comprises a plurality of gate lines; and
the second lead parts are arranged at the same layer as the gate lines, and the second lead parts are made of the same material as the gate lines.

8. The touch panel according to claim 6, wherein the touch panel further comprises a plurality of data lines; and
the second lead parts are arranged at the same layer as the data lines, and the second lead parts are made of the same material as the data lines.

9. The touch panel according to claim 1, wherein material of the first photo spacers comprises positive photoresist, and material of the second photo spacers comprises negative photoresist.

10. A display device, comprising the touch panel according to claim 1.

11. A method for fabricating a touch panel, comprising:
forming a plurality of spacers and a plurality of touch electrode lines on a base substrate, wherein each of the spacers comprises a first photo spacer and a second photo spacer stacked successively on the base substrate; and each of the touch electrode lines comprises a first lead part and a second lead part, the first lead part at least covers a surface of the first photo spacer, adjacent to a cathode to be connected therewith, facing the cathode, and the second lead part is configured to electrically connect the first lead part with a corresponding pin on a touch integrated circuit; and
forming a cathode layer on the base substrate formed with the spacers and the touch electrode lines, wherein the cathode layer is segmented by the spacers into a plurality of cathodes arranged in a matrix, and each of the cathodes corresponds to at least one of the touch electrode lines, and is electrically connected with the first lead part of the corresponding touch electrode line;
wherein the first lead part fully covers the surface of the first photo spacer, and the different first lead parts cover the different first photo spacers.

12. The method according to claim 11, wherein forming the plurality of spacers and the plurality of touch electrode lines on the base substrate comprises:
forming the second lead parts on the base substrate;
forming the first photo spacers of the spacers on the base substrate formed with the second lead parts;
forming the first lead parts on the base substrate formed with the first photo spacers;
forming the second photo spacers, of the spacers, arranged opposite to the first photo spacers on the base substrate formed with the first lead parts; and
cutting corners of the formed second photo spacers; and
forming the cathode layer on the base substrate formed with the spacers and the touch electrode lines comprises:
forming the cathode layer on the base substrate after the corners of the second photo spacers are cut.

13. The method according to claim 12, wherein cutting corners of the formed second photo spacers comprises:
cutting corners of the formed second photo spacers in a laser process.

14. The method according to claim 12, wherein cutting corners of the formed second photo spacers comprises:
cutting corners of the formed second photo spacers in an ashing process.

15. The method according to claim 12, wherein after the second lead parts of the touch electrode lines are formed on the base substrate, and before the first photo spacers of the spacers are formed on the base substrate formed with the second lead parts, the method further comprises:
forming a first insulation layer on the base substrate; and
forming via-holes corresponding to the touch electrode lines in a one-to-one manner by patterning the formed first insulation layer.

* * * * *